(12) United States Patent
Otsuka et al.

(10) Patent No.: US 7,906,840 B2
(45) Date of Patent: Mar. 15, 2011

(54) SEMICONDUCTOR INTEGRATED CIRCUIT PACKAGE, PRINTED CIRCUIT BOARD, SEMICONDUCTOR APPARATUS, AND POWER SUPPLY WIRING STRUCTURE

(75) Inventors: Kanji Otsuka, Higashiyamato (JP); Yutaka Akiyama, Hachiouji (JP)

(73) Assignees: Kyocera Corporation, Kyoto (JP); Oki Electric Industry Co., Ltd., Tokyo (JP); Kabushiki Kaisha Toshiba, Tokyo (JP); Fuji Xerox Co., Ltd., Tokyo (JP); Fujitsu Microelectronics Limited, Tokyo (JP); Renesas Technology Corp., Tokyo (JP); Ibiden Co., Ltd., Gifu (JP); Kanji Otsuka, Tokyo (JP); Yutaka Akiyama, Tokyo (JP)

( * ) Notice: Subject to any disclaimer, the term of this patent is extended or adjusted under 35 U.S.C. 154(b) by 119 days.

(21) Appl. No.: 12/204,677

(22) Filed: Sep. 4, 2008

(65) Prior Publication Data

US 2009/0072358 A1    Mar. 19, 2009

(30) Foreign Application Priority Data

Sep. 4, 2007   (JP) ................................. 2007-229497

(51) Int. Cl.
*H01L 23/02*   (2006.01)
(52) U.S. Cl. ... 257/678; 257/736; 257/750; 257/E23.019
(58) Field of Classification Search .................. 257/666, 257/679, 686, 723, 700, 758, 678, E23.019; 361/15–17
See application file for complete search history.

(56) References Cited

U.S. PATENT DOCUMENTS

| | | | |
|---|---|---|---|
| 4,946,645 A | 8/1990 | Namiki et al. | 420/84 |
| 6,522,173 B1 | 2/2003 | Otsuka | 326/101 |
| 6,670,830 B2 | 12/2003 | Otsuka et al. | 326/86 |
| 6,961,229 B2 | 11/2005 | Otsuka et al. | 361/301.2 |
| 6,975,489 B2 | 12/2005 | Otsuka et al. | 361/15 |
| 2001/0047588 A1* | 12/2001 | Schaper | 29/847 |
| 2002/0008597 A1 | 1/2002 | Otsuka et al. | 333/33 |

FOREIGN PATENT DOCUMENTS

| | | |
|---|---|---|
| JP | 01-246344 | 10/1989 |
| JP | 08-181445 | 7/1996 |
| JP | 11-284126 | 10/1999 |
| JP | 2001-211211 | 8/2001 |
| JP | 2002-026272 | 1/2002 |
| JP | 2003-218223 | 7/2003 |
| JP | 2004-007657 | 1/2004 |
| JP | 2004-221185 | 8/2004 |
| JP | 2004-259722 | 9/2004 |

* cited by examiner

*Primary Examiner* — Thao X Le
*Assistant Examiner* — Hoa B Trinh
(74) *Attorney, Agent, or Firm* — DLA Piper LLP (US)

(57) ABSTRACT

A semiconductor integrated circuit package, a printed circuit board, a semiconductor apparatus, and a power supply wiring structure that allow attainment of stable power source and ground wiring without causing resonance even in a high-frequency bandwidth are provided. In an interior portion of the package, a power source wiring and a ground wiring constitute a pair wiring structure in which the power source wiring and the ground wiring are juxtaposed at a predetermined interval so as to establish electromagnetic coupling therebetween. A plurality of pair wiring structures are combined in such a manner that, when viewed in a section perpendicular to a wiring extending direction, the pair wiring assembly assumes a staggered (checkered) configuration. It is preferable that, each of the silicon chip and the printed circuit board, like the package, has pair wiring structures disposed inside.

6 Claims, 12 Drawing Sheets

SEMICONDUCTOR INTEGRATED CIRCUIT PACKAGE, PRINTED CIRCUIT BOARD, SEMICONDUCTOR APPARATUS, AND POWER SUPPLY WIRING STRUCTURE

CROSS-REFERENCE TO THE RELATED APPLICATIONS

This application claims the benefit of priority under 35 USC 119 to Japanese patent application Ser. No. 2007-229497 filed Sept. 4, 2007, the entire content of which is incorporated herein by reference.

BACKGROUND OF THE INVENTION

1. Field of the Invention

The present invention relates to a semiconductor integrated circuit package, a printed circuit board, a semiconductor apparatus, and a power supply wiring structure that are suitable for use with high-speed signals.

2. Description of the Related Art

A band of frequencies currently used in semiconductor integrated circuits has already reached a GHz level and now got on track to exceed 10 GHz. In order to deal with such a high-speed signal, a power source is demanded of high-speed charge supply, and a ground (earth) is demanded of high-speed discharing when electric charge is unnecessary. A decoupling capacitor is disposed to serve such purposes, however, as indicated by the following formula (1), parasitic inductance L is present.

$$v = L\frac{di}{dt} \quad (1)$$

As a problem associated with the relationship represented by the formula (1), with a decrease of voltage corresponding to v, the higher the frequency becomes to effect high-speed variation, the more difficult the charge supply becomes.

Since it is difficult to decrease the parasitic inductance L in a practical manner, it is preferable that, as practiced in a multilayer board disclosed in Japanese Unexamined Patent Publications JP-A 8-181445 (1996), a decoupling capacitor is inserted in front of a switch circuit as a built-in component, for example. However, there is a limit to the degree of proximity of the decoupling capacitor to the switch circuit.

Moreover, in a greater-than-64-bit semiconductor integrated circuit, the supply of great current is desirable to effect simultaneous switching actions.

Variation in charge supply and discharge emerges in high-frequency component form, and power source and ground wirings extending to a decoupling capacitor provide the effect of a transmission line. Under the domination of the characteristic impedance exerted by the transmission line, current limitation is imposed in accordance with the Ohm's law as indicated by the following formula (2).

$$I = V_{dd}/Z_0 \quad (2)$$

In order to avoid this current limitation, in general, so-called solid (plane) power supply and solid (plane) ground are disposed in a printed circuit board. However, it is well known in the field of high-frequency circuits that resonance occurs in the presence of the high-frequency component that will eventually cause "EMI" problems.

SUMMARY OF THE INVENTION

It is needs to attain stable power source and ground wiring without causing resonance even in a high-frequency bandwidth.

A first aspect of the invention provides a semiconductor integrated circuit package having one main surface adapted to mount a semiconductor integrated circuit thereon, and another main surface on which a connecting terminal for establishing connection with a printed circuit substrate is disposed, comprising:

a power source wiring disposed in the package interiorly thereof so as to be electrically connected to a power terminal of the semiconductor integrated circuit; and a ground wiring disposed in the package interiorly thereof so as to be electrically connected to a ground terminal of the semiconductor integrated circuit, the power source wiring and the ground wiring constituting a pair wiring structure in which the power source wiring and the ground wiring are juxtaposed at a predetermined interval, the pair wiring structure extending over a range of from a connecting terminal of the semiconductor integrated circuit to the connecting terminal for establishing connection with the printed circuit substrate.

According to the first aspect of the invention, the power source wiring, which is disposed in the package interiorly thereof so as to be electrically connected to the power terminal of the semiconductor integrated circuit, and the ground wiring, which is disposed in the package interiorly thereof so as to be electrically connected to the ground terminal of the semiconductor integrated circuit, constitute a pair wiring structure in which the power source wiring and the ground wiring are juxtaposed at a predetermined interval. The pair wiring structure extends over a range of from the connecting terminal of the semiconductor integrated circuit to the connecting terminal for establishing connection with the printed circuit substrate.

In this construction, electromagnetic coupling is established between the power source wiring and the ground wiring, wherefore a transmission line structure can be obtained. In the absence of frequency characteristics, the construction is free from occurrence of resonance even in a high-frequency bandwidth. Accordingly, stable power source and ground wiring can be attained in the semiconductor integrated circuit package.

Moreover, a second aspect of the invention provides a printed circuit board comprising:

a semiconductor integrated circuit package having one main surface adapted to mount a semiconductor integrated circuit thereon, and another main surface on which a connecting terminal for establishing connection with a printed circuit substrate; and a printed circuit substrate adapted to mount the semiconductor integrated circuit package on one surface thereof and including a power circuit disposed in its interior portion, the semiconductor integrated circuit package including:

a package power source wiring disposed in the package interiorly thereof so as to be electrically connected to a power terminal of the semiconductor integrated circuit; and a package ground wiring disposed in the package interiorly thereof so as to be electrically connected to a ground terminal of the semiconductor integrated circuit, the package power source wiring and the package ground wiring constituting a package pair wiring structure in which the package power source wiring and the package ground wiring are juxtaposed at a predetermined interval, the package pair wiring structure extending over a range of from a connecting terminal of the semiconductor integrated circuit to the connecting terminal for establishing connection with the printed circuit substrate, the printed circuit substrate including:

a circuit substrate power source wiring disposed in the printed circuit substrate interiorly thereof so as to be electrically connected to a power terminal of the semiconductor integrated circuit package;

a circuit substrate ground wiring disposed in the printed circuit substrate interiorly thereof so as to be electrically connected to a ground terminal of the semiconductor integrated circuit package; and a bypass capacitor disposed at a given location in the semiconductor integrated circuit package or the printed circuit substrate where the circuit substrate power source wiring and the circuit substrate ground wiring are coupled together, the circuit substrate power source wiring and the circuit substrate ground wiring constituting a circuit substrate pair wiring structure in which the circuit substrate power source wiring and the circuit substrate ground wiring are juxtaposed at a predetermined interval, the circuit substrate pair wiring structures being combined and unified at the bypass capacitor and then connected to the power circuit.

According to the second aspect of the invention, in the semiconductor integrated circuit package; the package power source wiring, which is disposed in the package interiorly thereof so as to be electrically connected to the power terminal of the semiconductor integrated circuit, and the package ground wiring, which is disposed in the package interiorly thereof so as to be electrically connected to the ground terminal of the semiconductor integrated circuit, constitute a package pair wiring structure in which the package power source wiring and the package ground wiring are juxtaposed at a predetermined interval. The package pair wiring structure extends over the range of from the connecting terminal of the semiconductor integrated circuit to the connecting terminal for establishing connection with the printed circuit substrate.

In the printed circuit substrate, the circuit substrate power source wiring, which is disposed in the printed circuit substrate interiorly thereof so as to be electrically connected to the power terminal of the semiconductor integrated circuit, and the circuit substrate ground wiring, which is disposed in the printed circuit substrate interiorly thereof so as to be electrically connected to the ground terminal of the semiconductor integrated circuit, constitute a circuit substrate pair wiring structure in which the wirings are juxtaposed at a predetermined interval. A plurality of circuit substrate pair wiring structures are combined and unified at a given location in the semiconductor integrated circuit package or the printed circuit substrate by the bypass capacitor, and the combination is connected to the power circuit.

In this construction, electromagnetic coupling is established between the power source wiring and the ground wiring, wherefore a transmission line structure can be obtained. In the absence of frequency characteristics, the construction is free from occurrence of resonance even in a high-frequency bandwidth. Accordingly, stable power source and ground wiring can be attained in the printed circuit board on which is mounted the semiconductor integrated circuit package.

Moreover, a third aspect of the invention provides a semiconductor apparatus comprising:

a semiconductor integrated circuit; and a semiconductor integrated circuit package having one main surface adapted to mount the semiconductor integrated circuit thereon, and another main surface on which a connecting terminal for establishing connection with a printed circuit substrate is disposed, the semiconductor integrated circuit being so designed that a power source wiring and a ground wiring connected to a driver as well as to a receiver constitute a pair wiring structure in which the power wiring and the ground wiring are juxtaposed at a predetermined interval, the semiconductor integrated circuit package including:

a package power source wiring disposed in the package interiorly thereof so as to be electrically connected to a power terminal of the semiconductor integrated circuit; and a package ground wiring disposed in the package interiorly thereof so as to be electrically connected to a ground terminal of the semiconductor integrated circuit, the package power source wiring and the package ground wiring constituting a package pair wiring structure in which the package power source wiring and the package ground wiring are juxtaposed at a predetermined interval, the package pair wiring structure extending over a range of from a connecting terminal of the semiconductor integrated circuit to the connecting terminal for establishing connection with the printed circuit substrate.

According to the third aspect of the invention in the semiconductor integrated circuit, the power source wiring and the ground wiring connected to a driver as well as to a receiver constitute a pair wiring structure in which the power source wiring and the ground wiring are juxtaposed at a predetermined interval.

In the semiconductor integrated circuit package, the package power source wiring, which is disposed in the package interiorly thereof so as to be electrically connected to the power terminal of the semiconductor integrated circuit, and the package ground wiring, which is disposed in the package interiorly thereof so as to be electrically connected to the ground terminal of the semiconductor integrated circuit, constitute a package pair wiring structure in which the package power source wiring and the package ground wiring are juxtaposed at a predetermined interval. The package pair wiring structure extends over the range of from the connecting terminal of the semiconductor integrated circuit to the connecting terminal for establishing connection with the printed circuit substrate.

In this construction, electromagnetic coupling is established between the power source wiring and the ground wiring, wherefore a transmission line structure can be obtained. In the absence of frequency characteristics, the construction is free from occurrence of resonance even in a high-frequency bandwidth. Accordingly, stable power source and ground wiring can be attained in the package in which is mounted the semiconductor integrated circuit.

Moreover, a fourth aspect of the invention provides a power supply wiring structure that extends from a semiconductor integrated circuit, through a package for mounting the semiconductor integrated circuit, to a power circuit disposed in a printed circuit substrate, comprising:

a power source wiring and a ground wiring laid out from a functional block of the semiconductor integrated circuit, the power source wiring and the ground wiring constituting a pair wiring structure in which power source wiring and the ground wiring are juxtaposed at a predetermined interval, the pair wiring structures being combined and unified at the power circuit without undergoing branching inside the package.

According to the fourth aspect of the invention, the power source wiring and the ground wiring laid out from the functional block of the semiconductor integrated circuit constitute a pair wiring structure in which the power source wiring and the ground wiring are juxtaposed at a predetermined interval. A plurality of pair wiring structures are combined and unified at the power circuit without undergoing branching inside the package.

In this construction, electromagnetic coupling is established between the power source wiring and the ground wiring, wherefore a transmission line structure can be obtained. In the absence of frequency characteristics, the construction is free from occurrence of resonance even in a high-frequency bandwidth. Accordingly, stable power source and ground wiring can be attained in the structural region ranging from the semiconductor integrated circuit to the printed circuit board.

BRIEF DESCRIPTION OF THE DRAWINGS

Other and further objects, features, and advantages of the invention will be more explicit from the following detailed description taken with reference to the drawings wherein.

DETAILED DESCRIPTION

Figure 1:
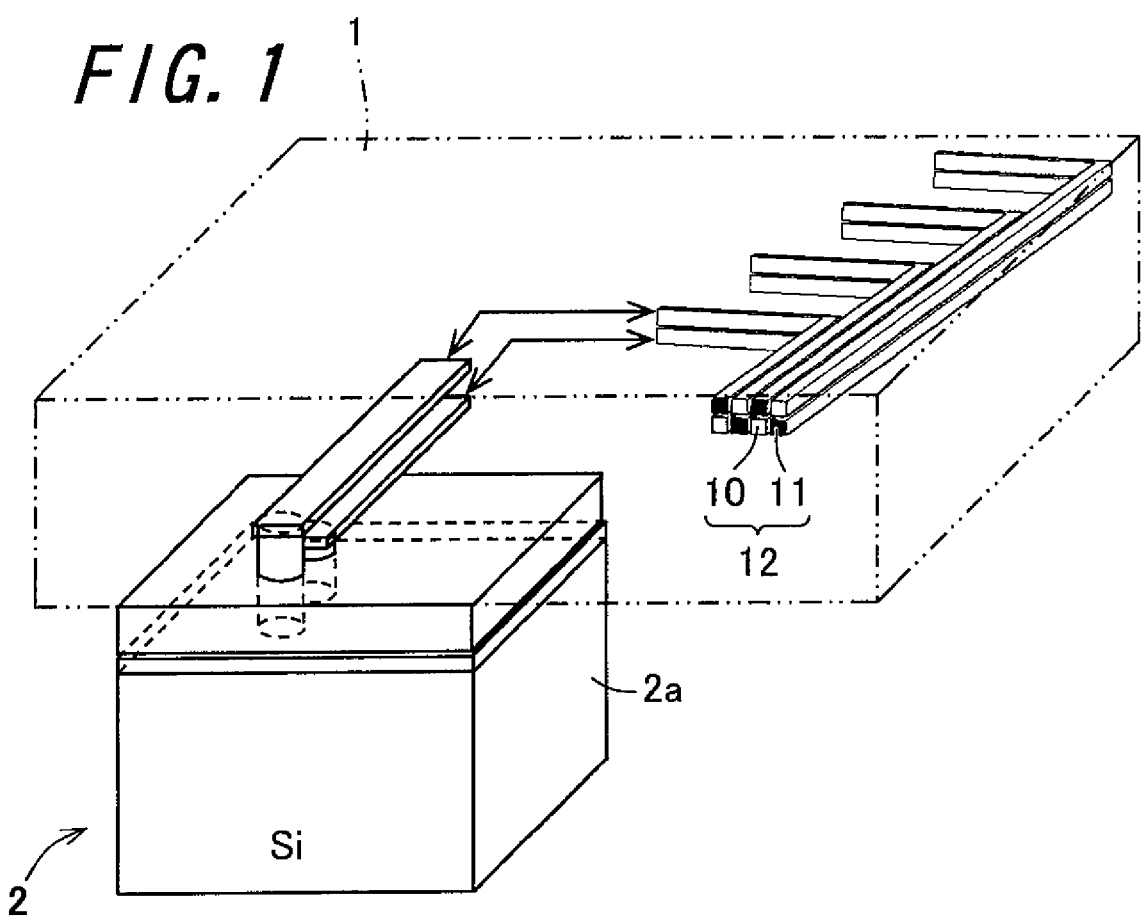
FIG. 1 is a view schematically showing a wiring structure of a package according to a first embodiment of the invention.

Now referring to the drawings, preferred embodiments of the invention are described below.

The invention is directed to such a matter that, in the internal wirings of a semiconductor integrated circuit package (hereafter referred to simply as "package"), a semiconductor integrated circuit, and a printed circuit board, a power source wiring and a ground wiring constitute a pair wiring structure in which the power source wiring and the ground wiring are juxtaposed at a predetermined interval. The power source wiring is electrically connected to a power terminal of the semiconductor integrated circuit, and the ground wiring is electrically connected to a ground terminal of the semiconductor integrated circuit.

A transmission line is free of frequency characteristics in a case where DC resistance is negligible. The pair wiring structure composed of the power source wiring and the ground wiring can be defined as a transmission line and thus regarded as a pipe capable of supplying and discharging charge at high speed. The pair wiring structure has a characteristic impedance which is smaller than parallel ON-state resistance obtained in a group of transistors being in an ON state in parallel which group of transistors is placed within a functional block classified as a lumped-constant circuit in the semiconductor integrated circuit. This means that the pair wiring structure is capable of effecting charging and discharging of sufficient amount of electrical charge for the transistor group in an ON state. If the condition that DC resistance is negligible can be maintained, no problem will arise even it the pair wiring structure is extended to a power circuit. In a case where the functional block has a large sizer a plurality of the pair wiring structures are prepared for use, and a group of them is coupled to the power circuit. This can be compared to a state where household aqueducts are each directly connected to a tank of the Waterworks Bureau.

Moreover, a transmission line interferes with an adjacent wiring in the presence of open electromagnetic field so long as it is not a coaxial cable. In tying up the pair wiring structures in a bundle, they are so arranged as to assume a staggered (checkered) configuration when viewed in a section perpendicular to a wiring extending direction by way of a structure with their electromagnetic waves aiding one another. This makes it possible to achieve a further decrease in characteristic impedance. As another advantage, this arrangement is free from occurrence of resonance, which is a problem associated with a solid power source or a sold ground.

At this time, if there is no coupling matching between a power-circuit side and a semiconductor integrated circuit's functional block side, reflection of a high-frequency component occurs, which may result in occurrence of resonance. In this regard, in the pair wiring structure disposed in the semiconductor integrated circuit, because of its slimness, DC resistance is present in some degree. Also in the pair wiring structure disposed in the package as well as in the printed circuit board, because of its largeness in length, DC resistance is present in some degree. Therefore, attenuation of resonance occurs; that is, occurrence of resonance is substantially non-problematic. In contrast, in a case where the pair wiring structure is incapable of serving as a transmission line under the condition that DC resistance is not negligible, with limitation imposed on the wiring length, a decoupling capacitor, which is provided specifically for a certain pair wiring structure, is disposed partway along the length of the pair wiring structure. In this way, it is possible to cope with the resonance problem.

As indicated by the formula (3), the capacitance of the decoupling capacitor may correspond to a value obtained on the basis of the current restricted in accordance with the formula (2) and the minimum unit of time, namely a half of clocking interval. The capacitance, as a matter of course, should preferably be greater than that, and more preferably be equal to or greater than 5 times as much as the value.

$$Q \leq I \times t_{clock}/2 \tag{3}$$

In a case where the system is increased in scale, the combination number of the pair-wiring bundles becomes so large that wiring unification may be needed. In this case, as indicated by the formula (4), the unification can be achieved with the provision of a decoupling capacitor such as to correspond to the combination number N of the pair-wiring bundles to be unified.

$$Q_{combing} = NQ \qquad (4)$$

The input/output circuit of the semiconductor integrated circuit contributes to augmentation of driving force, wherefore considerable electric power is required. In addition, switching of clock timing often takes place simultaneously, which is causative of occurrence of simultaneous switching noise (SSN). In order to prevent this, it is desirable to provide one pair wiring structure for a single driver or a single receiver on an individual basis. In this case, by virtue of different power source systems, SSN is not caused at all. It is also possible to provide, as a matter of course, one pair wiring structure for 2 to 4 pieces of drivers so long as prevention of SSN occurrence is ensured.

FIG. 1 is a view schematically showing a wiring structure of a package 1 according to the first embodiment of the invention. In the package 1, a semiconductor integrated circuit is mountable on one main surface thereof, and a connecting terminal is disposed on another main surface thereof for establishing connection with a printed circuit substrate.

In FIG. 1, in order to simplify an understanding of the wiring structure, an interior portion of the package 1 is represented in a see-through manner. Moreover, there is shown in the figure a single functional block 2a cut out from a silicon chip 2 acting as a semiconductor integrated circuit. That is, illustration of a plurality of other functional blocks is omitted. The functional block 2a is built as a lumped-constant circuit and takes on a multilayer wiring construction of conventional design. In the functional block 2a, a power source wiring and a ground wiring, in the form of unified pair wiring, are drawn out of a column. On a line extended from the column, the pair wiring structure is connected in a flip-chip manner to a column of the package 1 that is analogous to the column of the block.

In the package 1, a power source wiring 10 and a ground wiring 11 are juxtaposed at a predetermined interval thereby to constitute a pair wiring structure 12. Moreover, a plurality of the pair wiring structures 12 are arranged collectively in such a manner that, when viewed in a section perpendicular to a wiring extending direction, the pair wiring assembly assumes a staggered (checkered) configuration.

Inside the package 1, the pair wiring structure 12 extends over a range of from the connecting terminal of the silicon chip 2 to the connecting terminal for establishing connection with the printed circuit substrate. Note that there are some wiring portions that are not made in the form of pair wiring structure 12 due to their locations in the vicinity of the connecting terminals, limitations imposed on wiring, or other factors. However, the presence of such portions is unavoidable, and it is possible to make the best of advantages accruing from the provision of the pair wiring structure 12 so long as 80% or more of the wiring length of the power source wiring and ground wiring takes the form of the pair wiring structure 12. That is, also in this case, the retention of the paired wiring structure 12 is found to be effective.

In the package 1, the pair wiring structure 12 should preferably be so designed that its characteristic impedance can be ⅕ part of load resistance. For example, given the load resistance of 50Ω, then the characteristic impedance is 10Ω. In regard to the power source wiring 10 and the ground wiring 11, for example, in a case where the dielectric substance constituting the package 1 exhibits a specific dielectric constant given as: $\varepsilon r = 3.5$, the wiring width falls in a range of from 1 μm to 500 μm, and the wiring thickness thereof falls in a range of from 0.1 μm to 20 μm. In the pair wiring structure 12 formed by juxtaposing the wirings in a direction perpendicular to the direction of thickness of the package, namely a direction parallel to the main surface of the package, with respect to a gap between the power source wiring 10 and the ground wiring 11, the characteristic impedance stands at 10Ω at a ratio of (wiring width/gap)=18.2. Accordingly, the gap is expressed as: wiring width×1/18.2.

For example, given the wiring Width of 100 pmt then the gap is 5.5 μm. In a case where $\varepsilon r = 9$, with respect to the wiring width ranging from 0.1 μm to 50 μm, the characteristic impedance stands at 10Ω at a ratio of (wiring width/gap)=11.4. Accordingly, the gap is expressed as: wiring width×1/11.4. For example, given the wiring width of 100 μm, then the gap is 8.8 μm. Regarding resistive load, in general, a multiplicity of loads are connected in parallel with one another. Thus, there is a trend toward increasingly low characteristic impedance for a pair of power source and ground.

Inside the package 1, by providing the pair wiring structure 12 according to such a design, it is possible to establish electromagnetic coupling between the power source wiring 10 and the ground wiring 11, and thereby provide stability in the power source wiring 10 and the ground wiring 11.

Moreover, in a case where a plurality of the pair wiring structures 12 are arranged collectively in a staggered configuration, calculation is made under the assumption that the staggered arrangement fulfills a condition where the total wiring width is given as: the above-described wiring width× the number (N) of the pair wiring structures (N-fold wiring width). In the pair wiring structure 12 formed by juxtaposing (arranging side by side) the wiring lines in the direction of thickness of the package 1, the gap between the power source wiring 10 and the ground wiring 11 is substantially the same as the layer thickness of a dielectric layer constituting the package 1. In a case where the specific dielectric constant of the dielectric substance is expressed as: $\varepsilon r = 3.5$, given the border spacing of ⅕ part of the wiring width, then the total wiring width can be reduced by approximately ⅓ and the following relationship holds: (total wiring width in non-staggered arrangement)×⅔=(total wiring width in staggered arrangement). In a case where $\varepsilon r = 9$, the total wiring width can be reduced by approximately ½ and the following relationship holds: (total wiring width in non-staggered arragemnent)×½=(total wiring width in staggered arrangement). In this way, the adoption of the staggered arrangement enables saving of the area of power source wiring and ground wiring.

For example, under the assumption that the power source wiring 10 and the ground wiring 11 are each 500 μm in wiring width as well as in wiring thickness, that the gap is 100 μm, and that the specific dielectric constant of the dielectric layer is expressed as: $\varepsilon r = 0.5$, then the characteristic impedance of the power source wiring 10 and the ground wiring 11 stands at 50Ω. In a case where four pieces of such pair wiring structures 12 are collectively arranged in a staggered configuration, the composite characteristic impedance stands at 8Ω. That is, the characteristic impedance is smaller than 12.5Ω, which is the parallel resistance obtained in a case where the four pair wiring structures 12 are arranged in parallel with but independently of one another.

This is an electromagnetic coupling effect produced by the staggered arrangement. A plurality of the pair wiring structures 12 placed in the staggered arrangement are further combined together to form a bundle, and the pair wiring structures in bundle form are connected to the power circuit and eventually unified at the capacitor.

Figure 2:
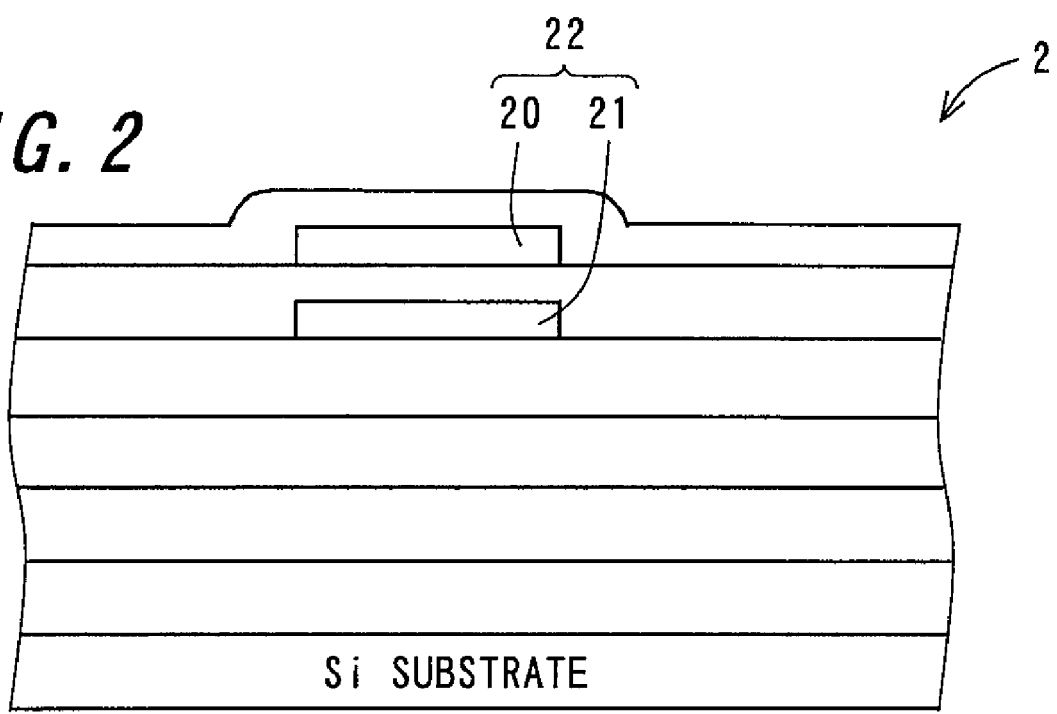
FIG. 2 is a view showing an example of an I/O interface of a silicon chip according to a second embodiment of the invention.

FIG. 2 is a view showing an example of an I/O interface of the silicon chip 2 according to the second embodiment of the invention. One pair wiring structure 22 formed by juxtaposing a power source wiring 20 and a ground wiring 21 at a predetermined interval in the direction of thickness of the silicon chip is connected to each of nMOS (Metal Oxide Semiconductor) and pMOS of a differential circuit with ON-state resistance of 100Ω and ESD (Electrostatic Sensitive Devices) transistors connected in the input/output section. These pair wiring structures 22, which are four in number, are combined together to form a set of pair wiring. The pair wiring set is connected to a column which is connected to the package 1.

Figure 3:
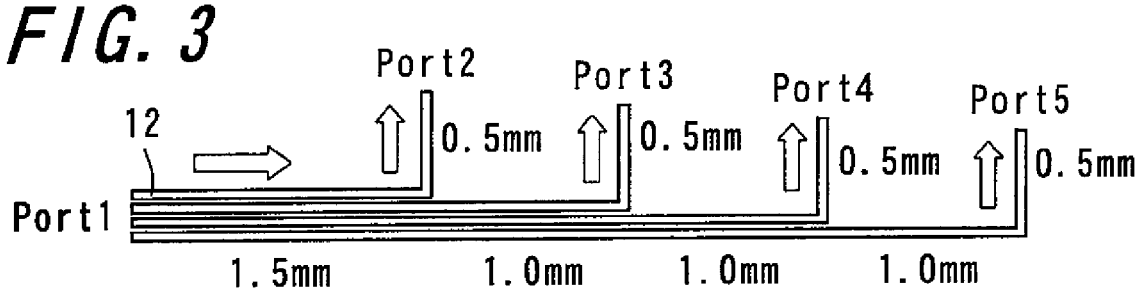
FIG. 3 is a view showing an S-parameter simulation model.

FIG. 3 is a view showing an S-parameter simulation model. The simulation model is constructed on the basis of the pair wiring structure 12 provided as the internal wiring of the package 1 shown in FIG. 1.

In this simulation model, with respect to one pair wiring structure 12, the power source wiring 10 and the ground wiring 11 are each set to be 48.8 μm in wiring width as well as in wiring thickness, the gap is set at 10 μm and the specific dielectric constant of the dielectric layer is expressed as: ∈r=3.5. Moreover, four pair wiring structures are placed collectively in a staggered arrangement.

The four pairs have an input terminal, as Port 1, in common with one another. Out of the four pairs, one pair wiring structure assumes a wiring pattern composed of a 1.5 mm-length straight line portion and a 0.5 mm-length straight line portion connected so as to be perpendicular to each other. The output terminal thereof is Port 2. Out of the four pairs, another pair wiring structure assumes a wiring pattern composed of a 2.5 mm-length straight line portion and a 0.5 mm-length straight line portion connected so as to be perpendicular to each other. The output terminal thereof is Port 3. Out of the four pairs, still another pair wiring structure assumes a wiring pattern composed of a 3.5 mm-length straight line portion and a 0.5 rm-length straight line portion connected so as to be perpendicular to each other. The output terminal thereof is Port 4. Out of the four pairs, yet another pair wiring structure assumes a wiring pattern composed of a 4.5 mm-length straight line portion and a 0.5 mm-length straight line portion connected so as to be perpendicular to each other. The output terminal thereof is Port 5

Figure 4:
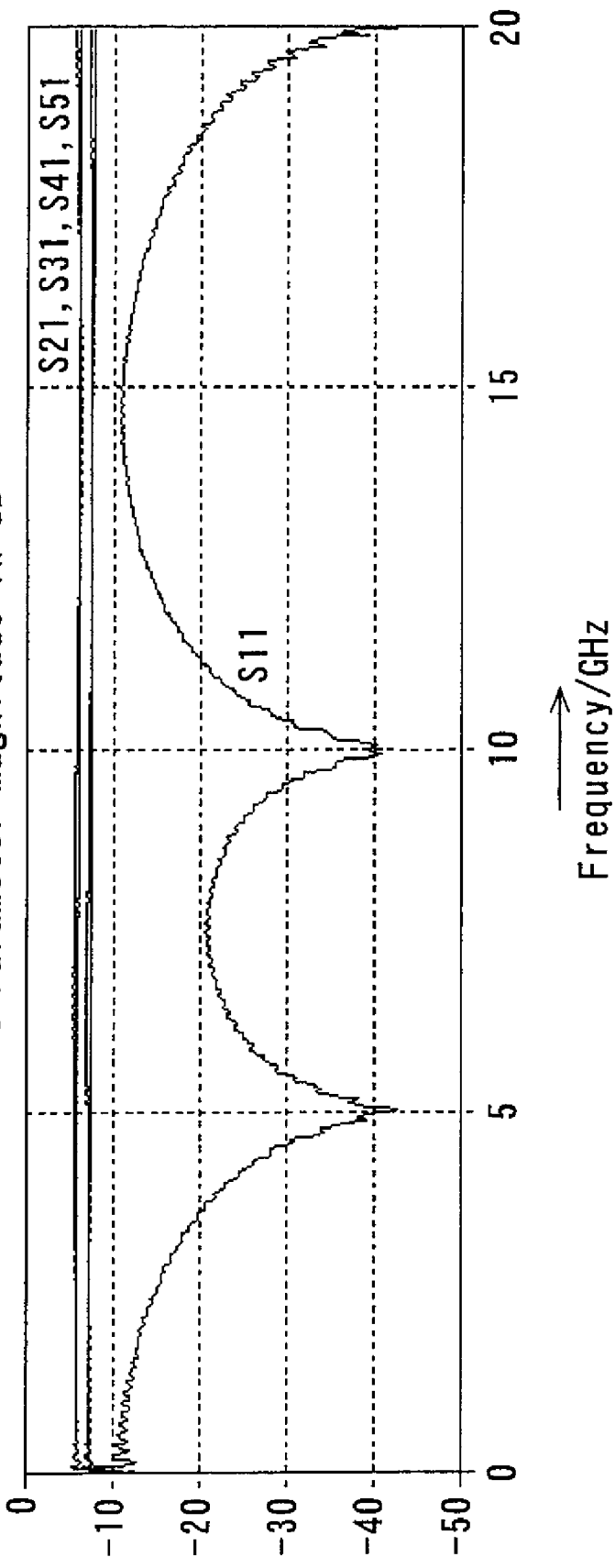
FIG. 4 is a chart showing a result of S-parameter simulation.

FIG. 4 is a chart showing a result of S-parameter simulation. In each of the wiring structures, it was confirmed that the segments S21, S31, S41, and S51 plotted in the chart for representing insertion characteristics were completely flat until the frequency level has reached 20 GHz, and as a result, the wiring structures are devoid of frequency characteristics. The segment S11 representing reflection characteristics turned out to be a state as indicated by the chart because of each port being terminated at 58Ω.

Figure 5:
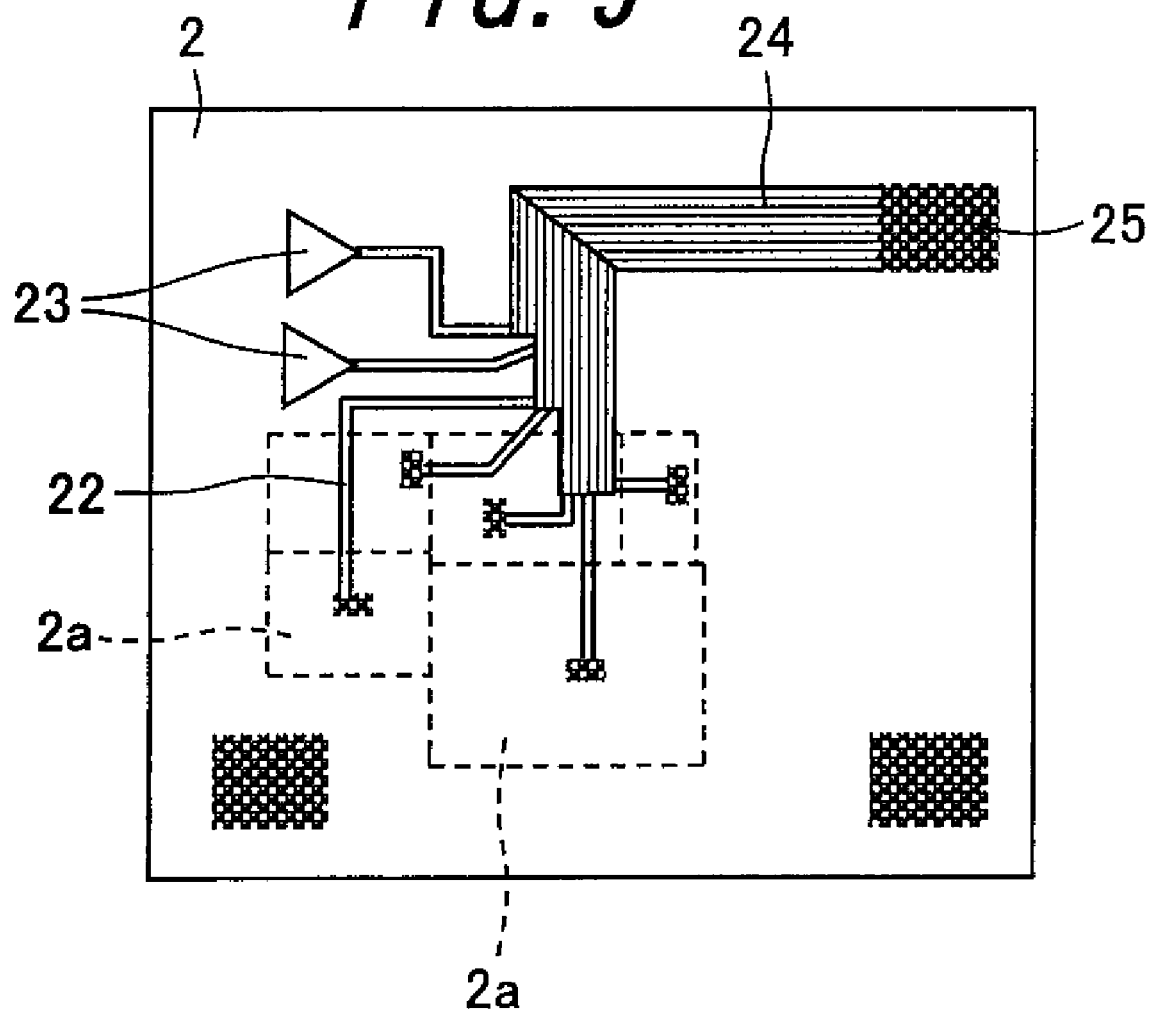
FIG. 5 is a plan view showing an inner wiring structure of the silicon chip according to the second embodiment of the invention in a see-through manner.

FIG. 5 is a plan view showing an inner wiring structure of the silicon chip 2 according to the second embodiment of the invention in a see-through manner.

The inner wiring of the silicon chip 2 is installed in conformity with the wiring of a lumped-constant circuit. One or more pair wiring structures are connected to each of input/output drivers 23 and functional blocks 2a on an individual basis, and eventually coupled to the nearest staggered wiring section 24. The staggered wiring sections 24 are each formed by placing a plurality of the pair wiring structures 22 in a staggered arrangement and configured so as to extend to a connecting via-portion 25 that provides connection with the package. The staggered wiring sections 24 each possesses a single via-hole or column, and the via-holes (or columns) are also placed in a staggered arrangement. The silicon chip 2 and the package 1 are electrically connected to each other by means of the columns or in a flip-chip manner.

Figure 6:
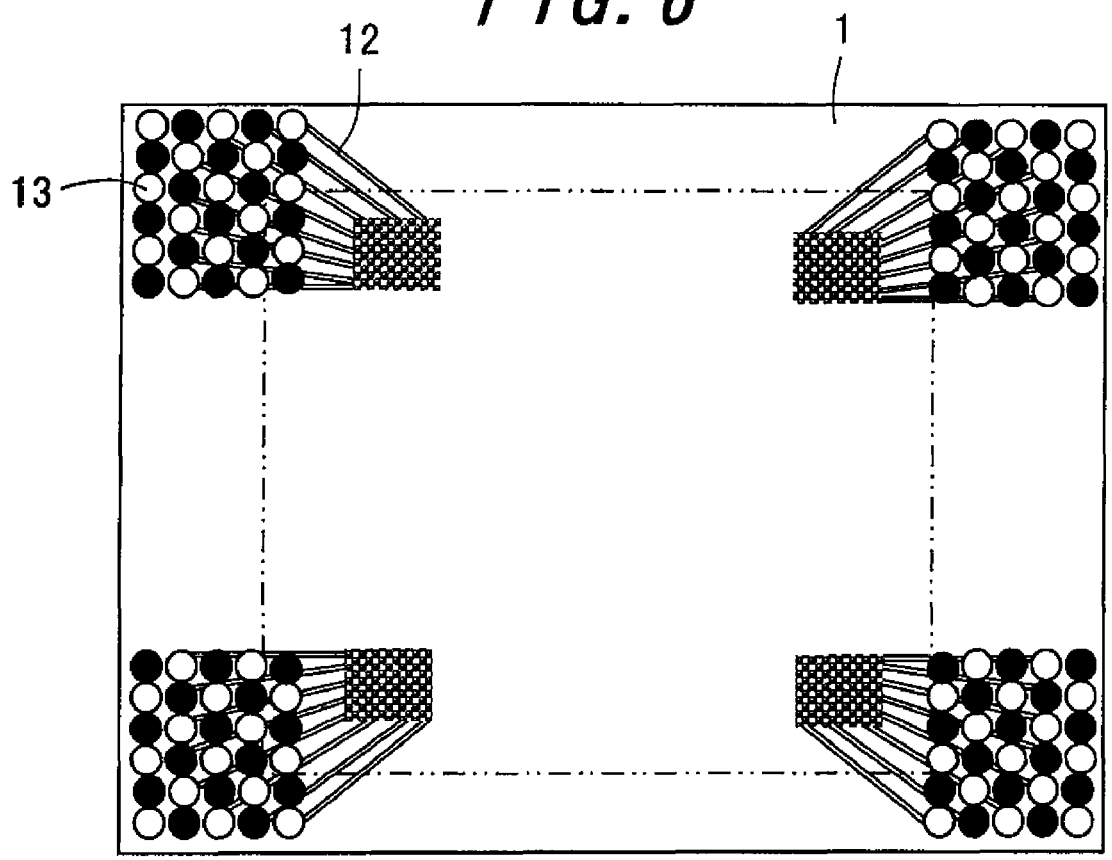
FIG. 6 is a plan view showing the inner wiring structure of the package according to the first embodiment of the invention in a see-through manner.

FIG. 6 is a plan view showing the inner wiring structure of the package 1 according to the first embodiment of the invention in a see-through manner.

The columns to be connected to the silicon chip 2 each possesses the inner wiring of the package 1. Also in the interior portion of the package 1, as shown in FIG. 1, the pair wiring structure 12 assumes a staggered arrangement. For the purpose of providing connection matching between the pair wiring structure and the printed circuit substrate which will be described later, the installation of the pair wiring structure 12 is made in enlarged form inside the package 1. Since the enlarged wiring structure bears similarity to the original structure, even if the pair wiring structure 12 has an enlarged dimension, its characteristic impedance is maintained constant. Following the enlargement, the pair wiring structure 12 is connected to solder bumps 13 that are also placed in a staggered arrangement. The package 1 and the printed circuit substrate are electrically connected to each other through the solder bumps.

Figure 7:
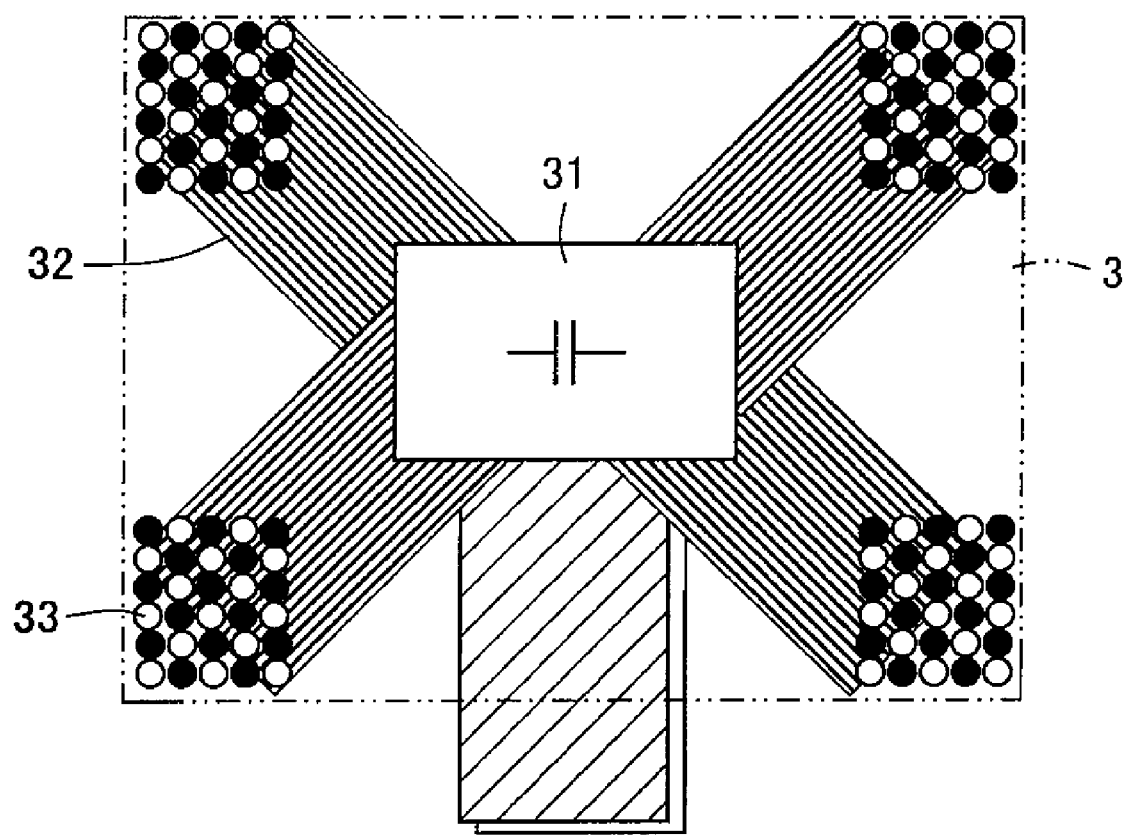
FIG. 7 is a plan view showing the inner wiring structure of a printed circuit substrate according to a third embodiment of the invention in a see-through manner.

FIG. 7 is a plan view showing an inner wiring structure of a printed circuit substrate 3 according to the third embodiment of the invention in a see-through manner.

Also in the interior portion of the printed circuit substrate 3, just as is the case with the package 1, a pair wiring structure 32 is disposed, and more specifically a plurality of the pair wiring structures 32 are placed in a staggered arrangement. The pair wiring structures are independently connected to their respective wiring structures of the package 1 through solder bumps 33 of the printed circuit substrate 3 that correspond to the solder bumps 13 of the package 1. In the interior portion of the printed circuit substrate 3, the staggered pair wiring structures 32 are so disposed as to extend from the staggered solder bumps 33 toward a decoupling capacitor 31 where the pair wiring structures 32 are congregated and unified thereby to constitute common wiring. The common wiring is connected to a power circuit section while maintaining the pair wiring structures.

Figure 8:
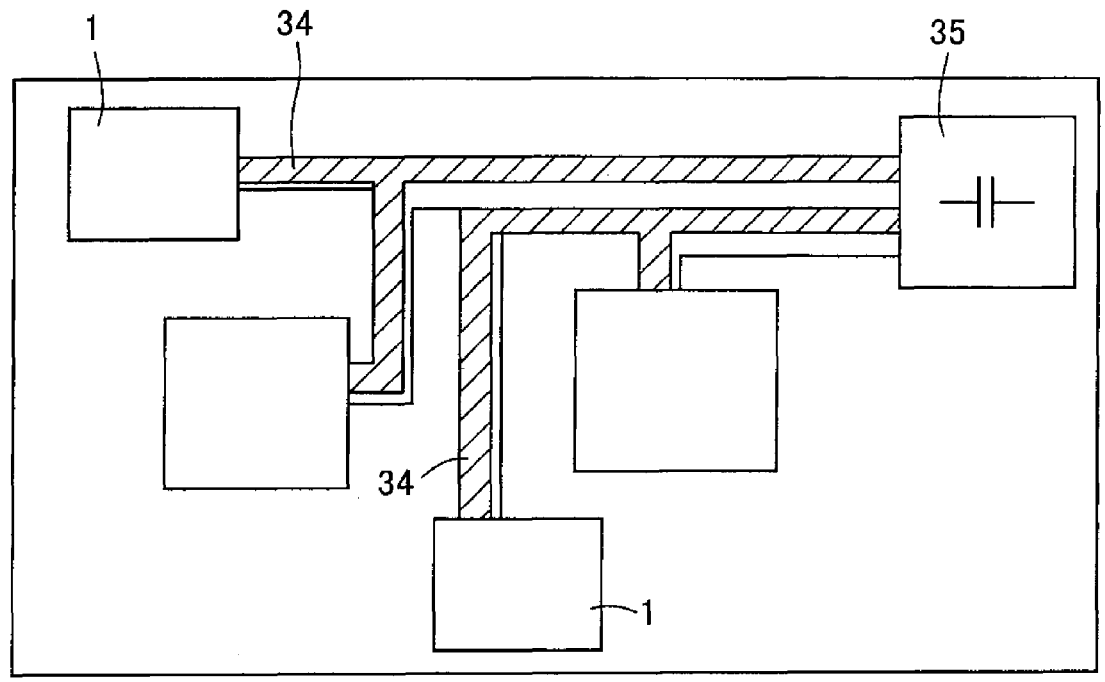
FIG. 8 is a plan view showing the configuration of the printed circuit substrate that is generally constructed in a common-wiring design with the provision of a power circuit capacitor.

FIG. 8 is a plan view showing the configuration of the printed circuit substrate 3 that is generally constructed in a common-wiring design with the provision of a power circuit capacitor.

In the common wiring (hereafter referred to as "pair common wiring") 34 having the pair wiring structures congregated at the decoupling capacitor, its characteristic impedance may be given as $Z_{0c}$, which is provided independently of the composite characteristic impedance $Z_{0g}$ of the relevant staggered pair wiring structures. In this case, however, it is preferable that the condition of $Z_{0c} \leq Z_{0g}$ is fulfilled and the ratio $Z_{0c}/Z_{0g}$ falls in a range of from ⅕ to ½. In the construction shown in FIG. 8t a plurality of the packages 1 are mountable on the printed circuit substrate 3, and the pair common wiring 34 extended from each of the packages is connected to the power circuit section 35. At this time, in a structural region ranging from each of the packages 1 to the power circuit section 35, a plurality of the pair common wirings 34 are, just like the pair wiring structures 32 each composed of the power source wiring and the ground wiring, placed in a staggered arrangement. By arranging the pair common wirings 34 in a staggered configuration, it is possible to minimize the composite characteristic impedance and thereby allow the construction to deal with electric current undergoing high-speed variation. These staggered pair common wirings 34 are eventually extended to a large-capacitance electrode of the power circuit section 35 so as to merge into a single power source. Note that, needless to say, in a case where a plurality of power supply voltages are provided, groups of the common wirings are disposed independently of one another for each of the power supply voltages.

Figure 9:
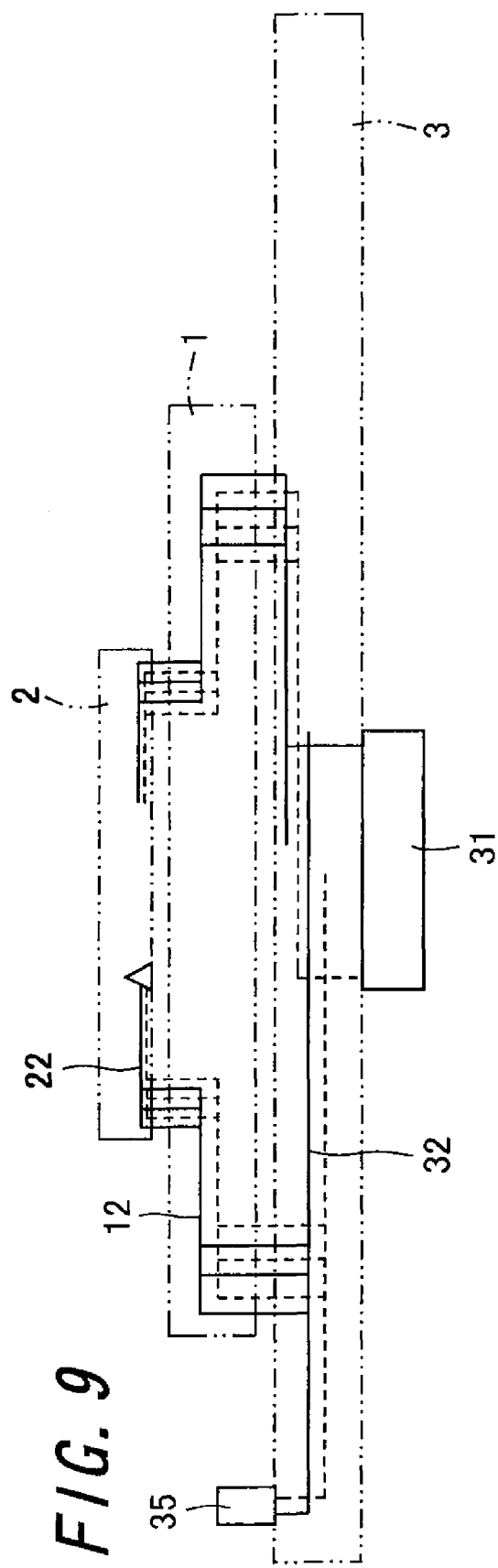
FIG. 9 is a sectional view showing the structure of the printed circuit substrate on which is mounted the silicon chip-bearing package.

FIG. 9 is a sectional view showing the structure of the printed circuit substrate 3 on which is mounted the silicon chip 2-bearing package 1.

In the interior portion of the silicon ship 2, the staggered pair wiring structures 22 are disposed so as to establish flip-chip connection with the package 1 via the staggered columns. In the interior portion of the package 1, the staggered pair wiring structures 12 are disposed so as to establish connection with the printed circuit substrate 3 via the staggered solder bumps. In the interior portion of the printed circuit substrate 3, the staggered pair wiring structures 32 are unified at the decoupling capacitor 31 into the pair common wiring 34 that is connected to the power circuit section 35.

In this way, in the structural region ranging from the silicon chip 2, through the package 1, to the printed circuit substrate 3, the pair wiring structure of the silicon chip, the pair wiring structure of the package, and the pair wiring structure of the printed circuit substrate should preferably be disposed independently of one another. Note that the ground wiring does not necessarily have to be at ground potential but may be at standard potential, namely reference potential.

EXAMPLE

By way of the example of the invention, there was constructed a model of the printed circuit substrate 3 on which was mounted the silicon chip 2-bearing package 1, and the modeled construction was subjected to a simulation on power fluctuation as observed at the time of switching.

Figure 10:
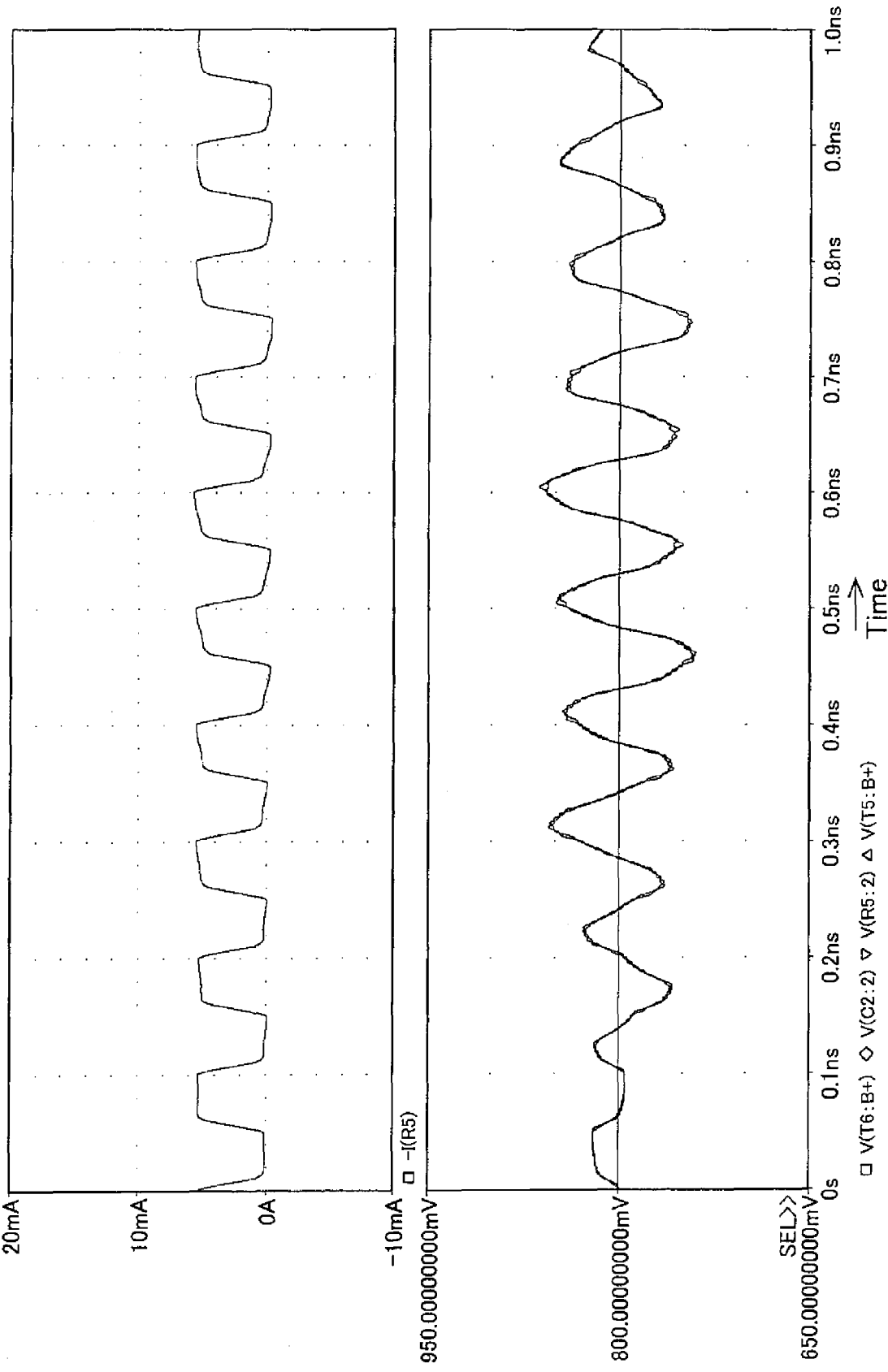
FIG. 10 is a chart illustrating a result of power fluctuation simulation for the case of switching action in one driver as to the printed circuit substrate on which is mounted the silicon chip-bearing package.

FIG. 10 is a chart illustrating a result of power fluctuation simulation for the case of switching action in one driver as to the printed circuit substrate 3 on which is mounted the silicon chip 2-bearing package 1.

In the printed circuit substrate 3, the pair wiring structure (100 mm in length) was connected at the power source. The characteristic impedance of this pair wiring structure was expressed as: $5\Omega=\sqrt{3}$ nH/0-12 nF. The wiring having a length of 100 mm exhibited a DC resistance of $0.1\Omega$. A decoupling capacitor (0.1 pF in capacitance) is, as was conventional, placed in close proximity to the power source. Next, the pair wiring structure was connected via a solder bump to the pair wiring structure of the package 1. The parasitic capacitance of this solder bump was set at 1 pF. The pair wiring structure of the interior portion of the package 1 was so designed as to constitute $\frac{1}{10}$ part of that of the printed circuit substrate, and its line characteristic equaled $\frac{1}{10}$ of that of the printed circuit substrate. The characteristic impedance of the pair wiring structure was $5\Omega$. The pair wiring structure, now connected relatively to the package 1, was connected relatively to the silicon chip 2 via a connection pad. Through the connection pad (0.1 pF in capacitance), the pair wiring structure disposed inside the chip, which was $5\Omega$ in characteristic impedance and 2 mm in length, was coupled to the driver. The chip internal wiring exhibited a DC resistance as high as $32.8\Omega$. The on-state resistance of the driver was set at $100\Omega$, and the parasitic capacitance of a driver transistor was set at 62.5 fF. The equivalent circuit for transistor switching operations was represented by pulse voltage power source and current control resistance of $50\Omega$.

In expectation of the performance capability of the third-generation high-speed driver, a simulation was conducted at a clock frequency of 10 GHz, with supposed rise time and fall time at high speed of 10 ps.

As shown in the chart, the silicon chip 2, the package 1, and the printed circuit substrate 3 behaved in the same way. It thus was confirmed that, although the power source exhibited fluctuation of approximately ±50 mV, an adequate margin could be secured with respect to the power supply voltage of 0.8 V.

Figure 11:
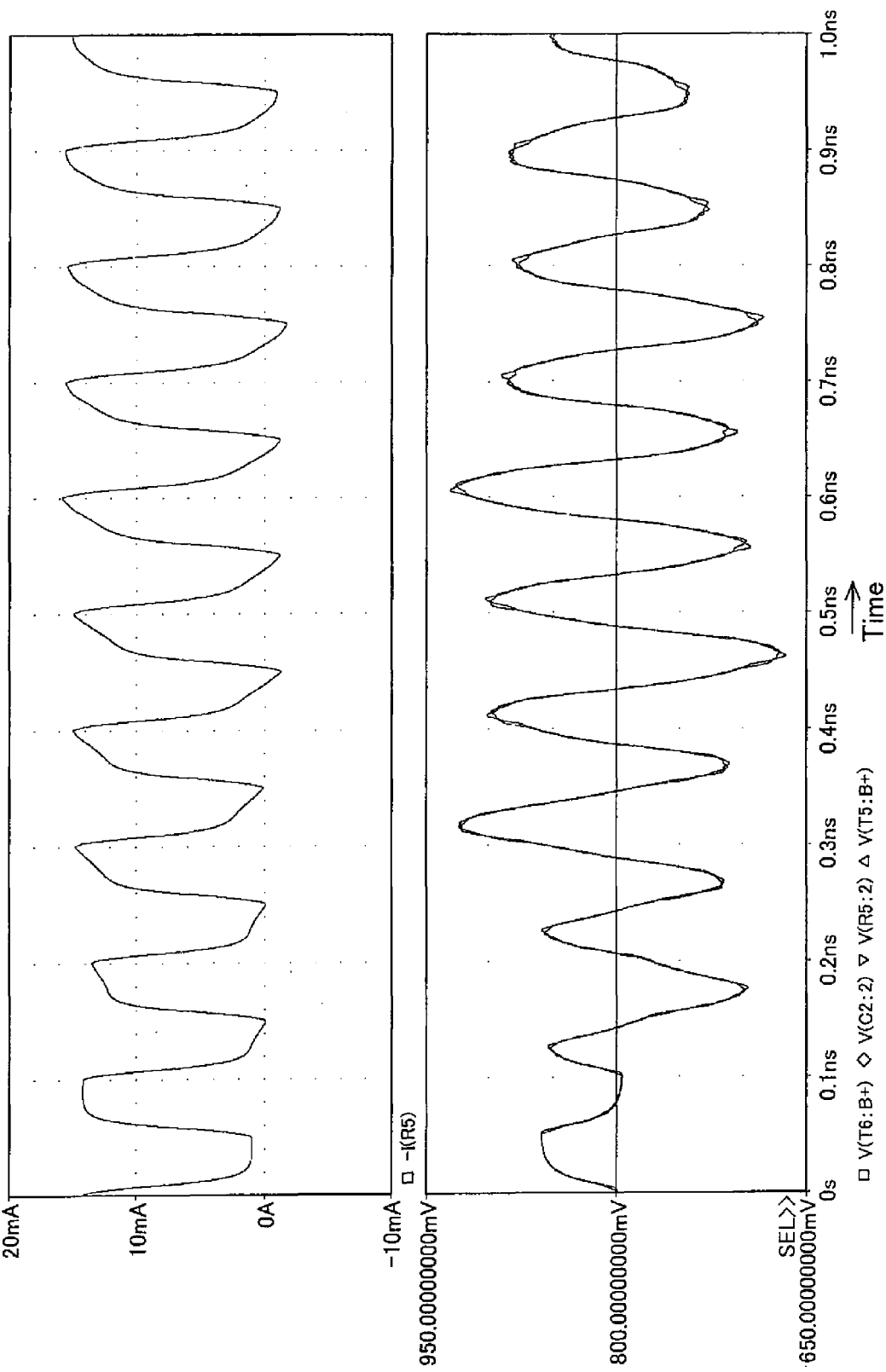
FIG. 11 is a chart illustrating a result of power fluctuation simulation for the case of switching action in sixteen drivers as to the printed circuit substrate on which is mounted the silicon chip-bearing package.

FIG. 11 is a chart illustrating a result of power fluctuation simulation for the case of switching action in sixteen drivers as to the printed circuit substrate 3 on which is mounted the silicon chip 2-bearing package 1.

In the case of the sixteen drivers, as compared with the case of the above-described 1 driver, the on-state resistance is reduced to $\frac{1}{16}$, whereas the parasitic capacitance represents a 16-fold increase.

As shown in the chart, the silicon chip 2, the package 1, and the printed circuit substrate 3 behaved in the same way. It thus was confirmed that, although the range of fluctuation degree in the power source was increased to approximately ±130 muV, there was still a margin with respect to the power supply voltage.

Figure 12:
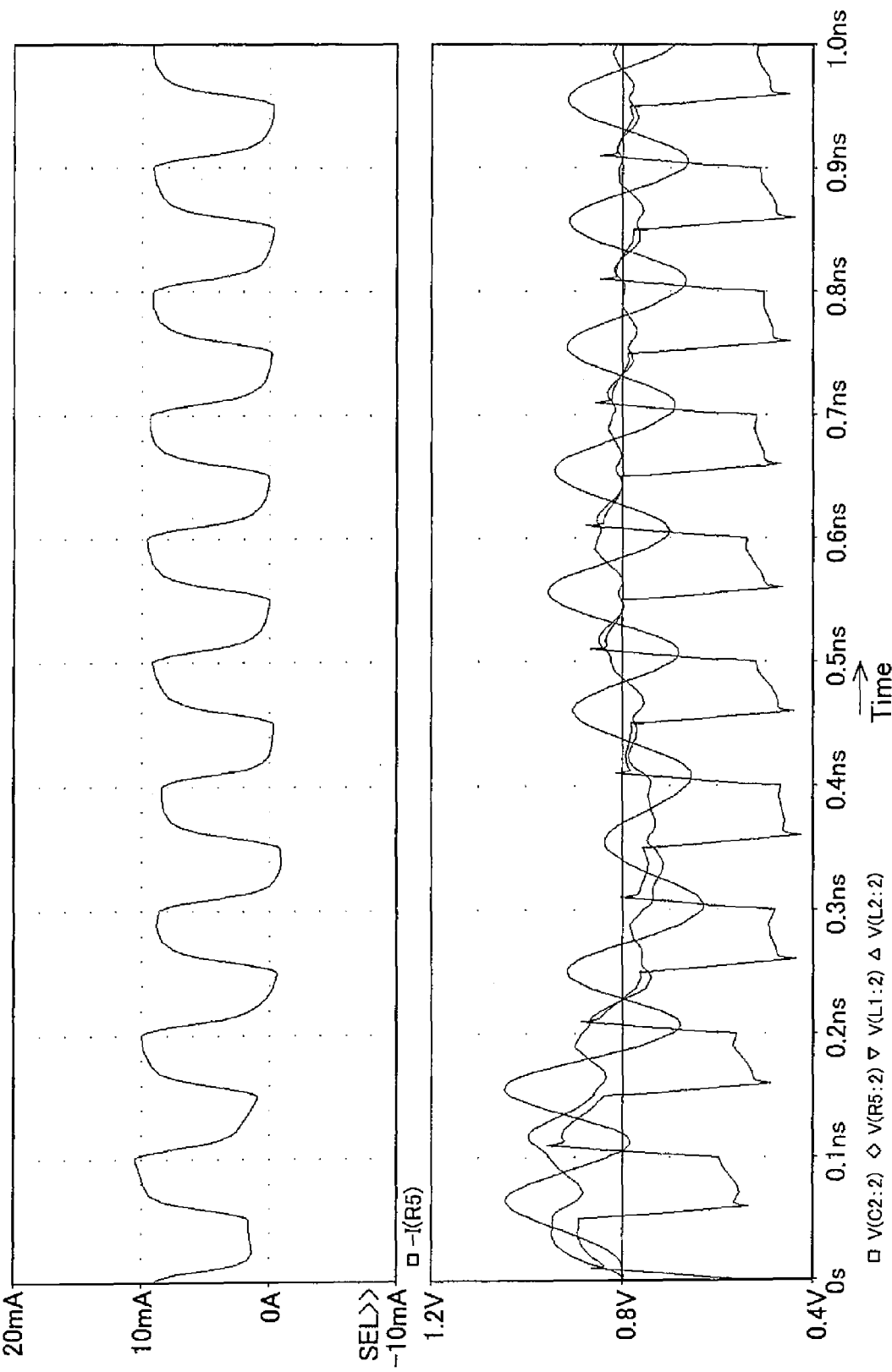
FIG. 12 is a chart showing a result of simulation on a comparative example.

By way of a comparative example, there was constructed a model of conventional power source wiring and ground wiring that were not designed in a paired wiring configuration. A simulation was conducted thereon basically in the same manner as in the example. The simulation result was shown in FIG. 12.

Provided that the power source wiring had an inductance that varied according to its length, with the adoption of the inductance as shown in FIG. 10, a simulation was conducted under the condition that the capacitance became slight with distance from the ground wiring; that is, under the condition that the capacitance=0.

As shown in the chart, in this construction, in contrast to the example, the silicon chip 2, the package 1, and the printed circuit substrate 3 behaved differently, and more specifically underwent fluctuation at different timings. The degree of fluctuation range was increased to approximately ±200 mV. Furthermore, because of superimposition of a VSW (voltage standing wave) in the wiring, fluctuation was caused in the range of ±350 mV maximum. This exceeded the permissible value of power fluctuation, that is, ±20% of supplied power voltage. In addition, there was a possibility of occurrence of electromagnetic radiation due to the presence of VSW.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A semiconductor integrated circuit package having one main surface adapted to mount a semiconductor integrated circuit thereon, and another main surface on which a connecting terminal for establishing connection with a printed circuit substrate is disposed, comprising:

a power source wiring disposed in the package interiorly thereof so as to be electrically connected to a power terminal of the semiconductor integrated circuit; and a ground wiring disposed in the package interiorly thereof so as to be electrically connected to a ground terminal of the semiconductor integrated circuit, the power source wiring and the ground wiring constituting a first and second pair wiring structures in which the power source wiring and the ground wiring are juxtaposed at a predetermined interval, wherein the first pair wiring structure is formed by juxtaposing the power source and ground wirings in a direction parallel to the main surface, the second pair wiring structure is formed by juxtaposing the power source and ground wirings in a direction perpendicular to the main surface, and a plurality of first pair wiring structures and a plurality of second pair wiring structures are congregated and arranged in a staggered arrangement when viewed in a section perpendicular to a wiring extending direction, the pair wiring structures of the staggered arrangement extending over a range of from a connecting terminal of the semiconductor integrated circuit to the connecting terminal for establishing connection with the printed circuit substrate.

2. The semiconductor integrated circuit package of claim 1, wherein the pair wiring structure of the staggered arrangement is connected between the connecting terminal of the semiconductor integrated circuit and the connecting terminal for establishing connection with the printed circuit substrate without undergoing branching inside the package.

3. The semiconductor integrated circuit package of claim 1, wherein a plurality of the pair wiring structures of the staggered arrangement are combined and unified by a bypass capacitor inside the package.

4. The semiconductor integrated circuit package of claim 1, wherein a plurality of the pair wiring structures of the staggered arrangement are so disposed as to be connected separately to different functional blocks of the semiconductor integrated circuit.

5. A semiconductor apparatus comprising:
a semiconductor integrated circuit; and
a semiconductor integrated circuit package having one main surface mounting the semiconductor integrated circuit thereon, and another main surface on which a connecting terminal for establishing connection with a printed circuit substrate is disposed,
the semiconductor integrated circuit being so designed that a power source wiring and a ground wiring connected to a driver as well as to a receiver constitute a pair wiring structure in which the power wiring and the ground wiring are juxtaposed at a predetermined interval,
the semiconductor integrated circuit package including:
a package power source wiring disposed in the package interiorly thereof so as to be electrically connected to a power terminal of the semiconductor integrated circuit; and
a package ground wiring disposed in the package interiorly thereof so as to be electrically connected to a ground terminal of the semiconductor integrated circuit, the package power source wiring and the package ground wiring constituting a first and second package pair wiring structures in which the package power source wiring and the package ground wiring are juxtaposed at a predetermined interval, wherein the first package pair wiring structure is formed by juxtaposing the package power source and package ground wirings in a direction parallel to the main surface, the second package pair wiring structure is formed by juxtaposing the package power source and package ground wirings in a direction perpendicular to the main surface, and a plurality of first package pair wiring structures and a plurality of second package pair wiring structures are congregated and arranged in a staggered arrangement when viewed in a section perpendicular to a wiring extending direction, the package pair wiring structures of the staggered arrangement extending over a range of from a connecting terminal of the semiconductor integrated circuit to the connecting terminal for establishing connection with the printed circuit substrate.

6. A power supply wiring structure that extends from a semiconductor integrated circuit, through a package for mounting the semiconductor integrated circuit, to a power circuit disposed in a printed circuit substrate, comprising:
a power source wiring and a ground wiring laid out from a functional block of the semiconductor integrated circuit,
the power source wiring and the ground wiring constituting a first and second pair wiring structures in which power source wiring and the ground wiring are juxtaposed at a predetermined interval, wherein the first pair wiring structure is formed by juxtaposing the power source and ground wirings in a direction parallel to the main surface, the second pair wiring structure is formed by juxtaposing the power source and ground wirings in a direction perpendicular to the main surface, and a plurality of first pair wiring structures and a plurality of second pair wiring structures are congregated and arranged in a staggered arrangement when viewed in a section perpendicular to a wiring extending direction,
the pair wiring structures of the staggered arrangement being combined and unified at the power circuit without undergoing branching inside the package.

* * * * *